United States Patent
Leverrier et al.

(10) Patent No.: US 6,825,512 B2
(45) Date of Patent: Nov. 30, 2004

(54) MICROMACHINED SENSOR WITH INSULATING PROTECTION OF CONNECTIONS

(75) Inventors: Bertrand Leverrier, Montelier (FR); Marie-Dominique Bruni-Marchionni, Coublevie (FR)

(73) Assignee: Thales, Paris (FR)

( * ) Notice: Subject to any disclaimer, the term of this patent is extended or adjusted under 35 U.S.C. 154(b) by 353 days.

(21) Appl. No.: 10/089,974

(22) PCT Filed: Aug. 7, 2001

(86) PCT No.: PCT/FR01/02567
§ 371 (c)(1),
(2), (4) Date: Apr. 8, 2002

(87) PCT Pub. No.: WO02/15256
PCT Pub. Date: Feb. 21, 2002

(65) Prior Publication Data
US 2002/0153257 A1 Oct. 24, 2002

(30) Foreign Application Priority Data
Aug. 11, 2000 (FR) .............................. 00 10581

(51) Int. Cl.[7] .............................. B05D 5/12; B05D 3/02; C25D 5/02; H01L 27/14; H01L 27/148
(52) U.S. Cl. .................. 257/252; 257/254; 257/417; 257/419; 257/420; 427/117; 427/118; 427/383.1; 427/383.3; 427/437; 427/419.2; 427/419.7; 427/430.1; 205/114; 205/118; 205/122; 205/123; 205/157; 205/220; 205/221; 205/261; 205/271
(58) Field of Search .............................. 427/117, 118, 427/383.1, 383.3, 437, 419.2, 419.7, 430.1; 205/114, 118, 122, 123, 157, 220, 221, 261, 271; 257/252, 254, 417, 419, 420

(56) References Cited

U.S. PATENT DOCUMENTS

| | | | |
|---|---|---|---|
| 4,126,532 A | * 11/1978 | Takao et al. | 204/426 |
| 5,110,034 A | * 5/1992 | Simmonds | 228/179.1 |
| 5,290,423 A | 3/1994 | Helber, Jr. et al. | 205/114 |
| 5,645,707 A | 7/1997 | Omoto | 205/114 |
| 5,693,208 A | 12/1997 | Paulet | 205/139 |
| 5,706,252 A | 1/1998 | Le Verrier et al. | 367/152 |
| 5,773,889 A | 6/1998 | Horne et al. | 257/737 |
| 5,998,864 A | 12/1999 | Khandros et al. | 257/723 |

FOREIGN PATENT DOCUMENTS

| | | | | |
|---|---|---|---|---|
| JP | 59161852 A | * 9/1984 | | H01L/23/48 |
| JP | 09 005187 | 1/1997 | | |
| JP | 10 153508 | 6/1998 | | |
| JP | 10242205 A | * 9/1998 | | H01L/21/60 |
| JP | 2003322574 A | * 11/2003 | | G01L/9/00 |
| WO | 99 54166 | 10/1999 | | |

* cited by examiner

Primary Examiner—Edna Wong
(74) Attorney, Agent, or Firm—Oblon, Spivak, McClelland, Maier & Neustadt, P.C.

(57) ABSTRACT

An active part of a sensor is formed, for example, by micro-machined silicon wafers bearing electronic elements, electrical conductors, connection pads, and pins. The pads are electrically connected to the pin ends by conductive elements. Then the wafer and the pin ends are plunged into an electrolytic bath to make an electrolytic deposit of conductive metal on the pin ends, the pads, and the conductive elements that connect them. Finally, this metal is oxidized or nitrized to form an insulating coat on the pin ends, the pads, and the conductive elements that connect them. Such a sensor may find particular application as a sensor designed to work in harsh environments.

7 Claims, 2 Drawing Sheets

MICROMACHINED SENSOR WITH INSULATING PROTECTION OF CONNECTIONS

FIELD OF THE INVENTION

The invention relates to the mounting of sensors of physical quantities capable of working in harsh environments.

BACKGROUND OF THE INVENTION

The mounting generally consists of the transfer of a micro-machined sensor to a base provided with electrical connection pins. The sensor is made, for example, out of several machined silicon wafers comprising mechanical elements (diaphragms, beams, seismic masses, etc), electronic elements (capacitor plates or strain gauges in particular), and metal contact pads used for electrical connection with the pins of the base when the sensor is fixed to the base.

Classically, the sensor is bonded or brazed by its rear face to the base, in a central part of this base that is surrounded by connection pins going through the base. The connection pads of the sensor, on the front face of this sensor, are connected by bonded wires between the connection pads and the tips of the connection pins that emerge from the surface of the base.

In this case, to ensure efficient operation in a harsh, wet or gaseous environment, it is necessary to cover the bonded wires, the connection pads and the ends of the pins with a protective insulating layer that prevents, firstly, the impairment of the sensor and, secondly, leakage currents between pins when the liquid or gas environment is not perfectly insulating. These leakage resistors indeed disturb the measurement of physical quantities which often relies on very small differential variations in resistance or on very weak electrical signals.

A polymerizable material, such as silicone resin, is then deposited on the conductive parts. Parylene may also be deposited. However, in applications such as pressure sensors, comprising a thin diaphragm in contact with the medium whose pressure is to be measured, it is necessary to avoid depositing this material on the diaphragm, because this would give rise to measurement errors and it is difficult to be aware of these errors and compensate for. Special precautions therefore have to be taken in depositing operations, and it may even be necessary to work by hand. Furthermore, this type of coating does not always withstand harsh environments.

SUMMARY OF THE INVENTION

The invention proposes to carry out an electrolytic deposition of metal on the conductive parts, followed by an operation for the oxidizing or nitriding of this metal so as to achieve the coating, with a layer of insulating oxide or nitride, of all the conductive parts that may subsequently come into contact with an ambient medium that is not perfectly insulating.

More specifically, the invention proposes a method for making a sensor of physical quantities consisting of the preparation of an active sensor part and a base, the active part comprising at least one wafer provided with conductive connection pads on one face and the base being provided with conductive pins, the electrical connection of the pads and the pins by conductive elements and then the plunging of the wafer and the pin ends into an electrolytic bath, the performance of an electrolytic deposition of at least one conductive metal on the pin ends, the pads and the conductive elements that connect them and the performance of an oxidizing or nitrizing operation on this metal to make an insulating coating on the connection pads, the connection pin ends and the conductive elements that connect them. The electrolytic deposit is made not only on the conductive parts but also on the insulating parts.

The term "electrolytic deposit" is understood to mean a metal deposit (a single metal or an alloy or combination of metals deposited simultaneously or successively) on a conductive zone obtained by the migration of metal ions coming from a liquid solution. The migration may be prompted either by the passage of an electrical current (a classic electrolytic bath with current lead-in electrodes), or by chemical reaction (using what is called electroless deposition).

This method may be implemented either when the bonding wires are bonded between the pads and the pin ends or when the pin ends are each soldered directly to a respective pad.

The electrolytic deposit designed to be then oxidised or nitrized may be, for example, a tantalum deposit giving rise to a tantalum oxide or tantalum nitride coating that is especially resistant to chemical corrosion or to temperature and pressure.

The oxidizing will generally be carried out in a step subsequent to the step of electrolytic metal deposition, but it is sometimes possible to obtain the metal oxide directly during the electrolysis itself rather than to carry out a metal deposition and then an oxidizing operation in succession.

BRIEF DESCRIPTION OF THE SEVERAL VIEWS OF THE DRAWINGS

Other features and advantages of the invention shall appear from the following description made with reference to the appended drawings, of which.

DESCRIPTION OF THE PREFERRED EMBODIMENTS

The invention shall be described with reference to a pressure sensor that has to work in a harsh environment, for example a sensor used to gauge the pressure of exhaust gases from an internal combustion engine or a pressure sensor placed within the cylinder of such an engine. The environment therein is harsh because of the very high temperatures (several hundreds of degrees Celsius) and the noxiousness of the surrounding environment (in terms of corrosive gases).

The invention can be applied however to other sensors.

Figure 1:
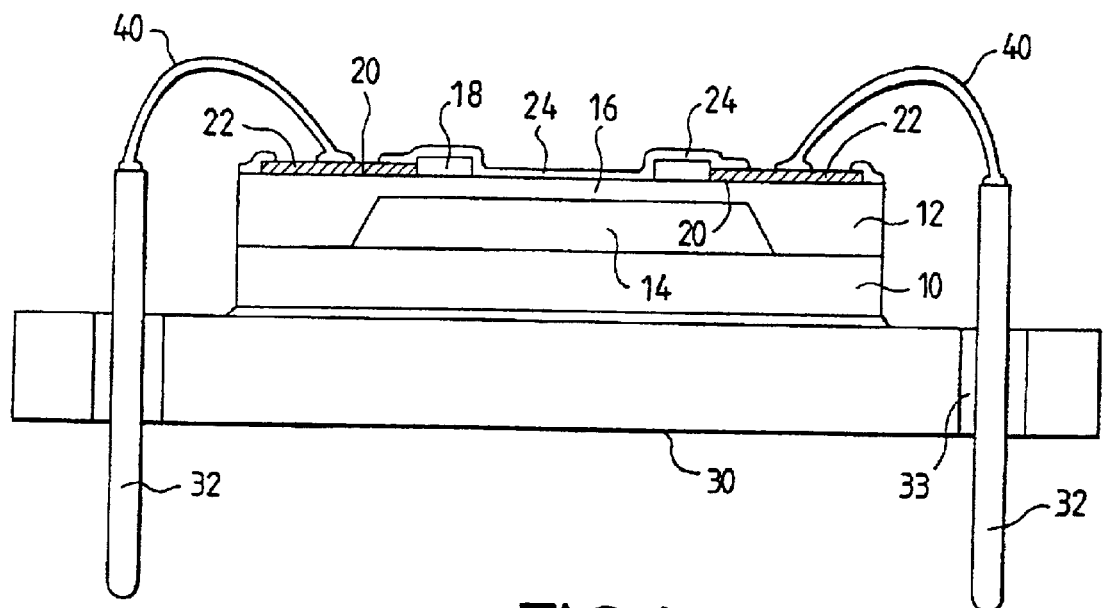
FIG. 1 shows a sensor whose active part is connected by bonded wires to the pins of the base.

FIG. 1 shows the sensor in an intermediate stage of manufacture, in which the active part of the sensor has been bonded to a base and connection wires have been bonded between connection pads of the active part and connection pins mounted on the base.

The active part of the sensor, in this example, is made out of two soldered silicon wafers 10 and 12, machined so as to demarcate a cavity 14 closed by a thin silicon diaphragm 16. The wafer 10 could be made of glass.

On the diaphragm 16, electronic elements 18 needed to detect the deformations of this diaphragm are formed by means of microelectronic manufacturing methods. In one example, these elements are strain gauges directly formed in the silicon (by the implantation of appropriate dopants in the silicon) or formed in a silicon layer separated from the silicon substrate by an insulating layer (this is the silicon-on-insulator structure). For very harsh environments, these gauges may be made on the diaphragm inside the cavity 14. If the environment is less difficult, they may be formed outside the cavity 14. The gauges are sensitive to the the deformations of the diaphragm prompted by the pressure variations to be measured.

Electrical connections 20 used for the power supply of the gauges and for the transmission of measurements made on these gauges are formed on the active part of the sensor. On a front face of the active part of the sensor, these connections lead to connection pads 22 which are conductive metal surfaces used for the electrical connection with external pins. The front face or main face of the active part of the sensor is the one facing upwards in FIG. 1. The front face is generally protected by a passivation layer 24 (made of silicon oxide or nitride for example) that lines the entire surface except for the connection pads 22 or at least their central part.

For the mounting of the active part of the sensor on a base, a base 30 is made with metal connection pins 32 going through this base. The number of these pins 32 is equal to the number of connection pads present on the sensor and necessary for the working of the sensor. The upper part of the pins reaches the upper surface or above the upper surface of the base. The lower part descends beneath the lower surface of the base and can be plugged for example into a female connector or into one of the holes of a printed circuit, or bonded to individual conductive wires, etc.

The base may be any insulator or conductive base, but in the latter case it must be planned that an insulator 33 (for example made of glass in the case of a metal base) will fill the passages into which the pins are inserted, in order to electrically insulate the pins from one another. In one embodiment, the base is a metal alloy such as Kovar, with glass-lined via holes. It could be made of insulating ceramic or even plastic for environments at moderate temperatures.

The active part of the sensor is soldered by its rear face to the upper surface of the base.

Conductive connection wires (for example gold wires) are bonded between the connection pads 22 and tips of the pins 32.

In the method according to the invention, the active part of the sensor as well as the upper part of the pins are then plunged into an electrolytic bath so that a conductive metal deposit is formed, by electrolytic migration, on the pads 22, the wires 40 and the upper part of the pins 32. The electrolytic deposit is formed only on the conductive parts plunged into the bath. In particular, it does not form on the diaphragm 16 lined with the passivation layer 24, so that the mechanical characteristics of the diaphragm are not impaired by the electrolytic deposit. One or more metals may be deposited, especially in the form of an alloy, or several metals may be deposited simultaneously.

Figure 2:
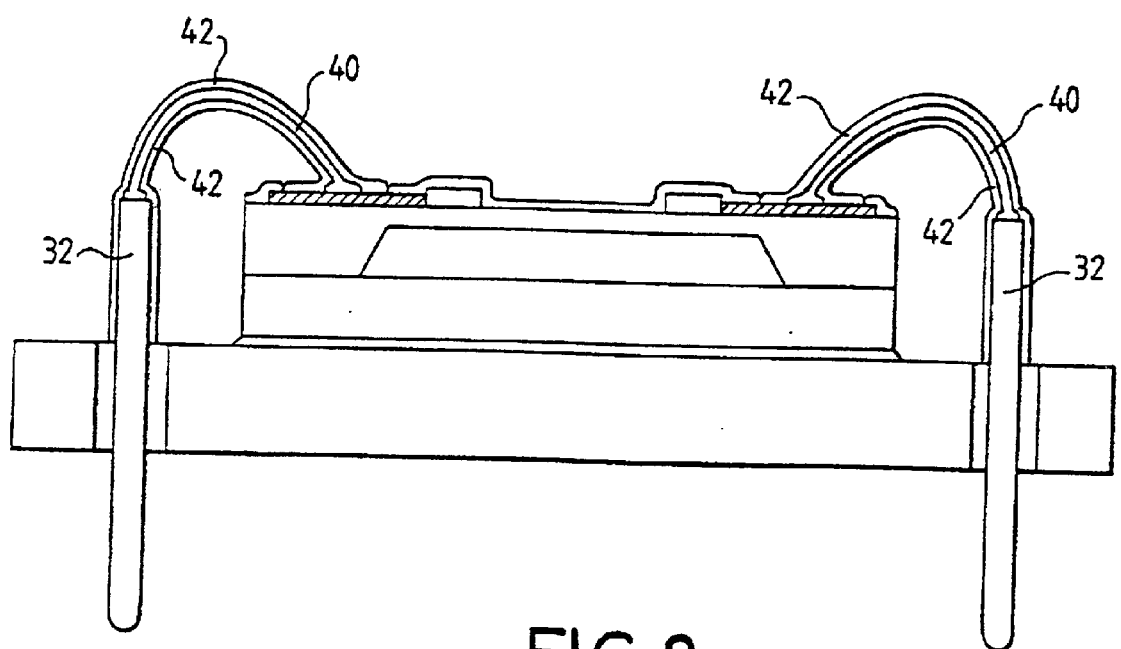
FIG. 2 shows the sensor of FIG. 1, after electrolytic metal deposition on the bonded wires and on the connection pads.

FIG. 2 shows the sensor thus lined with an electrolytic deposit 42 on all its conductive parts above the base: the parts located below the base are not plunged into the bath.

The metal deposited by electrolysis may be for example tantalum, but other metals are possible, especially nickel or tungsten or molybdenum. A combination of metals (alloy or co-deposition) may also be considered. The connection pads may be made of gold or other metals or a combination of metals (sometimes with several metal layers superimposed). If the deposit is made by classic electrolysis with the passage of current into a solution containing metal ions, it is seen to it that all the pins are connected together during the time of the electrolysis (preferably through the rear of the base, namely through a part that is not plunged into the electrolytic bath). An appropriate difference in electrolysis potential is applied between these pins and another electrode plunged into the bath.

And electroless deposit is also possible. In this case, the electrolysis occurs by simple chemical reaction between the pins are connection pads and the ion solution of the electrolytic bath, without the application of external potential differences.

An operation of surface oxidizing or nitrizing is then carried out on the electrolytic layer 42. The oxidized or nitrized surface layer 44 thus formed (FIG. 3) is insulating and highly resistant to corrosion by the external environment. In particular, the tantalum oxide that forms when the layer 42 is made of tantalum is highly resistant, even at high temperature, to moisture penetration, air salinity, corrosive agents etc. The conductive parts located above the base that had been lined with the electrolytic deposit 42 are thus lined with the insulating protective layer 44.

Apart from the fact that it protects the conductive parts against the corrosive environment, the layer of protective insulator 44 has the advantage of removing the need to protect the sensor by means of an insulating oil bath and a metal diaphragm as was done sometimes in the prior art to prevent electrical leakage between pins carried to different potentials. This type of assembly was costly, and the presence of the oil bath modified the characteristics proper to the sensor: for example, in the case of a pressure sensor, the external pressure was transmitted through the oil bath, thus generating measurement errors difficult to compensate for.

Figure 3:
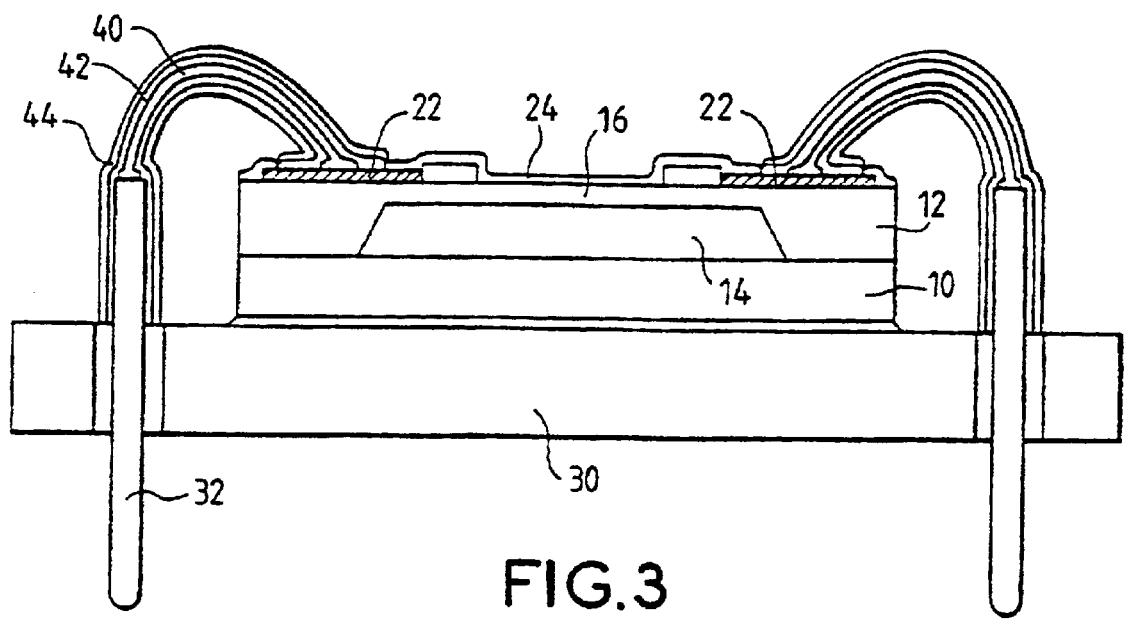
FIG. 3 shows the sensor according to the invention, after surface oxidising of the electrolytic deposit.

FIG. 3 shows the sensor provided with the layer 44 on all the conductive parts located above the base.

The parts of pins emerging out of the rear of the base are protected during the oxidizing or nitrizing operation, or else they are cleaned after this operation.

The oxidizing or nitrizing of the electrolytic layer deposited can be done either by annealing in an oxidizing atmosphere or by dipping in a chemical bath or an oxidising electrolytic bath. Sometimes, it can even be done during the electroless deposition.

The invention can be applied in another configuration, when the active part of the sensor is inverted with its front face pointing downwards, namely pointing toward the base, the active part being directly soldered by its conductive pads 22 to the tips of the pins 32.

Figure 4:
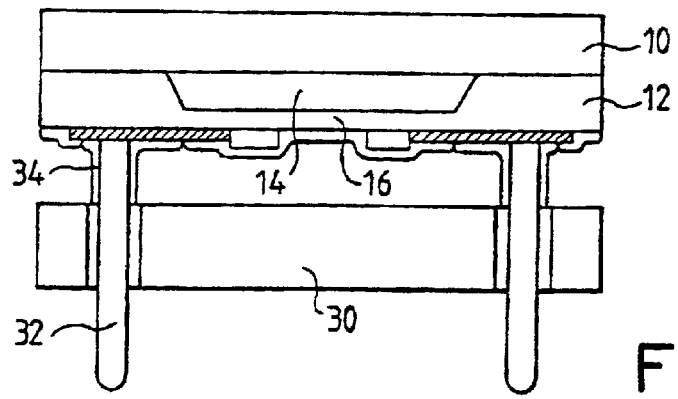
FIG. 4 shows a sensor whose active part is mounted in an inverted position and soldered to a base by an operation of electrolytic metal deposition.

FIG. 4 shows an intermediate manufacturing step in which the active part of the sensor has been fixed to its base as follows: each pin tip 32 reaches beyond the upper surface of the base, facing a respective pad 22, and it is held against this pad while the entire active part of the sensor and tips of the pads are plunged into an electrolytic bath. A metal deposit 34 is formed both on the pads and the pin ends. This deposit forms an electrolytic solder between the pads and the pins and the electrolysis is continued for a period of time long enough for the thickness deposited to form a rigid mechanical bond between the pads and the pins. The conductive elements between the pads 22 and the tips of the pins are constituted, in this case, by the electrolytic deposit 34 and not by wires as in FIGS. 1 to 3.

If the metal thus deposited by electrolytic means can be easily oxidized or nitrized, and if the oxide or nitride layer thus formed has the desired characteristics of resistance to corrosion, then the surface oxidizing or nitrizing of this metal can be done directly, either by annealing in an oxidising atmosphere or by dipping in an oxidising bath to make the desired protection layer on the conductive elements. If, on the contrary, the deposited metal is not easy to oxidize or to nitrize, or if the oxide or nitride formed is not resistant enough in the environment envisaged, then a new electrolytic deposit of another metal (tantalum especially) is made, followed by the surface oxidizing or nitrizing of this metal. This is the case especially if the first electrolytic deposit, used to solder the pads to the pins, is a copper deposit.

Figure 5:
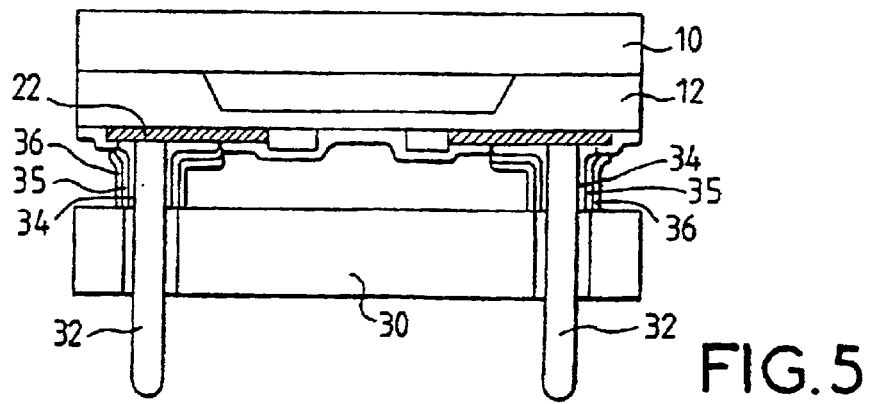
FIG. 5 shows the sensor of FIG. 4 after electrolytic deposition of the second metal layer and after the surface oxidising of this second metal layer.

FIG. 5 shows the sensor thus covered with the first electrolytically deposited layer 34 (copper for example) and then a second electrolytic layer 35 (preferably tantalum) and finally the insulating, oxidized surface layer 36 (tantalum oxide $Ta_2O_5$).

The invention can be applied especially to sensors of pressure, stresses, acceleration, temperature, gas or liquid, working in harsh environments.

What is claimed is:

1. Method for making a sensor of physical quantities comprising:

preparing an active sensor part and a base, the active part comprising at least one wafer provided with conductive connection pads on a first face and the base provided with conductive pins;

electrically connecting the pads and the pins by conductive elements;

plunging the wafer and ends of the pins into an electrolytic bath;

performing an electrolytic deposition of at least one conductive metal on the pin ends, the connection pads, and the conductive elements that connect them; and performing an oxidizing or nitrizing operation on the metal to make an insulating coat on the connection pads, the pin ends, and the conductive elements that connect them.

2. Method according to claim 1, wherein the electrolytic deposition is obtained by migration of metal ions coming from a liquid solution, with passage of electrical current into the solution.

3. Method according to claim 1, wherein the electrolytic deposition is an electroless deposition carried out by migration of metal ions coming from a liquid solution, without passage of electrical current.

4. Method according to claim 1, wherein the electrolytically deposited conductive metal is one of nickel, tantalum, tungsten or molybdenum.

5. Method according to claim 1, wherein the conductive elements are bonded wires.

6. Method according to claim 1, wherein the conductive elements that connect the pads electrically and mechanically to the pins includes an electrolytic metal deposit.

7. Sensor of physical quantities obtained by the method of claim 1, wherein the sensor constitutes a sensor of pressure, stresses, acceleration, temperature, gas or liquid.

* * * * *